(12) United States Patent
Kim et al.

(10) Patent No.: US 7,199,047 B2
(45) Date of Patent: Apr. 3, 2007

(54) BI-LAYER ETCH STOP PROCESS FOR DEFECT REDUCTION AND VIA STRESS MIGRATION IMPROVEMENT

(75) Inventors: Tae S. Kim, Dallas, TX (US); Jin Zhao, Plano, TX (US); Nathan J. Kruse, McKinney, TX (US); August J. Fischer, Dallas, TX (US); Ralf B. Willecke, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/857,150

(22) Filed: May 28, 2004

(65) Prior Publication Data

US 2005/0274955 A1 Dec. 15, 2005

(51) Int. Cl.
*H01L 21/4763* (2006.01)
(52) U.S. Cl. ...................... 438/637; 438/638; 438/672; 438/700
(58) Field of Classification Search ................ 438/637, 438/672–673, 700
See application file for complete search history.

(56) References Cited

U.S. PATENT DOCUMENTS

| 6,424,038 | B1* | 7/2002 | Bao et al. | 257/741 |
| 6,720,249 | B1* | 4/2004 | Dalton et al. | 438/624 |
| 2004/0127016 | A1* | 7/2004 | Hoog et al. | 438/637 |
| 2004/0198070 | A1* | 10/2004 | Xia et al. | 438/786 |
| 2005/0110153 | A1* | 5/2005 | Wu et al. | 257/762 |

OTHER PUBLICATIONS

IEEE International Reliability Physics Symposium, Mar. 30-Apr. 3, 2003, Dallas, Texas, Technical Program, 14 p., [online] http://www.irps.org/03-41st/TP_abstracts.pdf.

* cited by examiner

*Primary Examiner*—Dung A. Le
(74) *Attorney, Agent, or Firm*—Peter K. McLarty; W. James Brady, III; Frederick J. Telecky, Jr.

(57) ABSTRACT

A method of forming a film stack in an integrated circuit, said method comprising depositing a layer of silicon carbide adjacent a first layer of dielectric material, depositing a layer of silicon nitride adjacent the layer of silicon carbide, and depositing a second layer of dielectric material adjacent the layer of silicon nitride.

9 Claims, 1 Drawing Sheet

BI-LAYER ETCH STOP PROCESS FOR DEFECT REDUCTION AND VIA STRESS MIGRATION IMPROVEMENT

BACKGROUND

An integrated circuit dielectric stack may comprise multiple layers of dielectric material. During fabrication of a dielectric stack, each of these layers of dielectric material is formed adjacent to another layer of material. Etch-stop layers generally are deposited between dielectric layers for use during etch-stop processes. However, the bonding and film properties of various etch-stop layers and dielectric materials can cause various problems. Specifically, defects that form as a result of poor adhesion strength between etch-stop layers and layers of dielectric material often delaminate ("peel off") and spread throughout the dielectric stack, rendering useless a device comprising the dielectric stack.

"Via-stress migration" is another common problem attributable to the film properties of various etch-stop layers and layers of dielectric material and commonly occurs during extended operation of a device comprising the etch-stop layers and dielectric material. Via-stress migration may be induced by the stress of the films comprising the dielectric stack and electrically conductive metal lines (e.g., vias) encapsulated within the dielectric stack. The force exerted on metal lines by the stress mismatch between the dielectric stack and the metal lines gives rise to the accumulation of voids in the metal lines, thereby resulting in damaged metal lines. Damaged metal lines render the device useless.

BRIEF SUMMARY

The problems noted above are solved in large part by a method of forming a film stack in an integrated circuit, said method comprising a silicon carbide and silicon nitride bi-layer etch stop stack that reduces or eliminates via-stress migration and the production and/or delamination of defects. One exemplary embodiment may comprise depositing a layer of silicon carbide adjacent a first layer of dielectric material, depositing a layer of silicon nitride adjacent the layer of silicon carbide, and depositing a second layer of dielectric material adjacent the layer of silicon nitride.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to. . . . " Also, the term "couple" or "couples" is intended to mean either an indirect or direct electrical connection. Thus, if a first device couples to a second device, that connection may be through a direct electrical connection, or through an indirect electrical connection via other devices and connections. Further, the term "adjacent" is generally meant to be interpreted as "abutting" and/or "immediately next to," although in some embodiments, the term may be interpreted as "near" or "in close proximity to." Thus, two adjacent items may abut one another or be separated by an intermediate item.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1A:
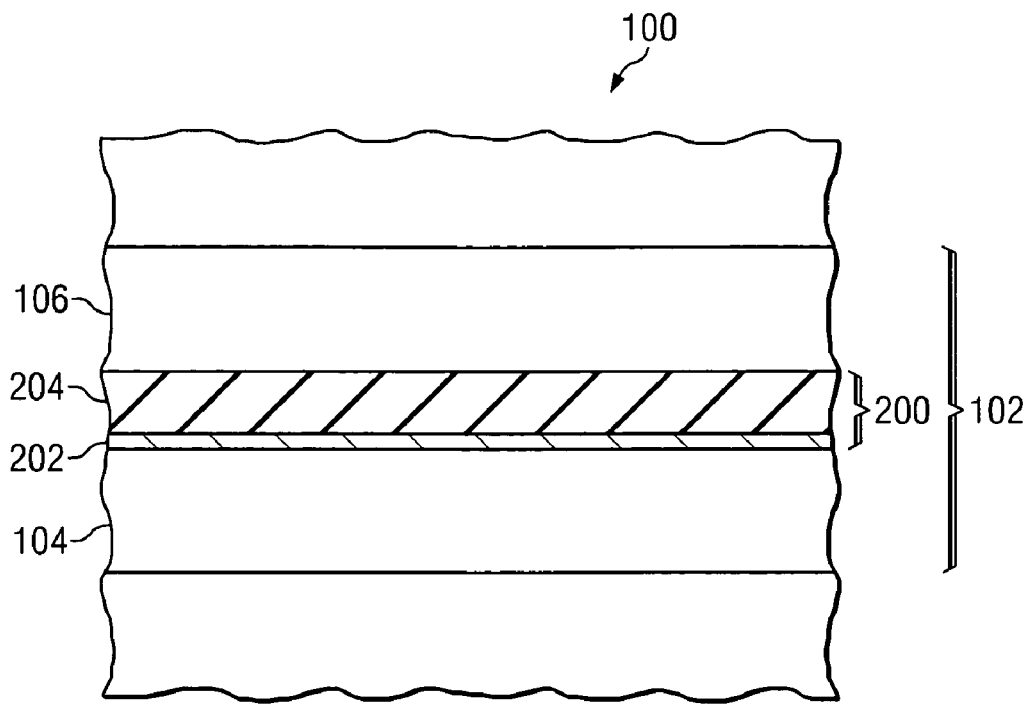
FIG. 1*a* shows a dielectric stack comprising a silicon carbide and silicon nitride bi-layer etch stop stack that is fabricated in accordance with a preferred embodiment of the invention.

Described herein is a manufacturing process that reduces or eliminates via-stress migration and the formation of defects induced by delamination of dielectric films. FIG. 1*a* shows a cross-sectional view of an integrated circuit dielectric stack 100 comprising, among various layers of metal, dielectric material and etch-stop layers, a film stack 102. The film stack 102 preferably comprises a silicon carbide and silicon nitride bi-layer etch stop stack 200 sandwiched between an organo-silicate glass ("OSG") layer 104 and a fluoro-silicate glass ("FSG") layer 106. As described below, the bi-layer etch-stop stack 200 reduces or eliminates the occurrence of via-stress migration and/or the formation of defects. As described herein, the silicon nitride layer 204 of the stack 200 may considerably reduce the occurrence and/or severity of via-stress migration. The silicon carbide layer 202 of the stack 200 substantially reduces the formation of the defects described above.

The adhesion strength between many etch-stop materials and OSG is generally poor, resulting in the formation of defects due to delamination. However, the adhesion strength between silicon carbide and OSG is considerably strong. Accordingly, the silicon carbide layer 202 is deposited adjacent the OSG layer 104 to prevent the formation of defects due to delamination. In general, the silicon carbide layer 202 may be relatively thin in comparison to the silicon nitride layer 204 and still achieve substantial adhesion strength with the OSG layer 104. As previously explained, this adhesion strength prevents defect formation, even if the OSG layer 104/etch-stop stack 200 is exposed to ambient conditions (e.g., ambient temperature, humidity) for a prolonged period of time. In a preferred embodiment, the silicon carbide layer 202 may range between approximately 100 angstroms and approximately 300 angstroms in thickness. In other embodiments, the silicon carbide layer 202 thickness is equal to or less than approximately 300 angstroms, although the scope of this disclosure also encompasses silicon carbide layers thicker than 300 angstroms. Furthermore, in some embodiments, the silicon carbide layer 202 may be pre-treated with an appropriate substance (e.g., helium, ammonia) to improve the adhesive properties of the silicon carbide layer 202 and to remove at least some unwanted substances from the silicon carbide layer 202 (e.g., passivation chemicals) prior to deposition.

Via-stress migration usually occurs due to the inability of electrically conductive metal lines to withstand forces induced by the surrounding dielectric material layers. Silicon nitride generally has lower stress levels than silicon carbide and thus is better able to preserve the functional integrity of the vias. Accordingly, the silicon nitride layer 204 is deposited adjacent, preferably abutting, the silicon carbide layer 202 to prevent via-stress migration upon deposition of the FSG layer 106. The silicon nitride layer 204 may be considerably thicker than the silicon carbide layer 202, such that the bi-layer etch stop stack 200 is of a thickness appropriate for an etching process. In a preferred embodiment, the thickness of the silicon nitride layer 204 may be between approximately 300 angstroms and approximately 900 angstroms. In other embodiments, the thickness of the silicon nitride layer 204 may be approximately 500 angstroms, although thicker or thinner silicon nitride layers also may be used.

Figure 1B:
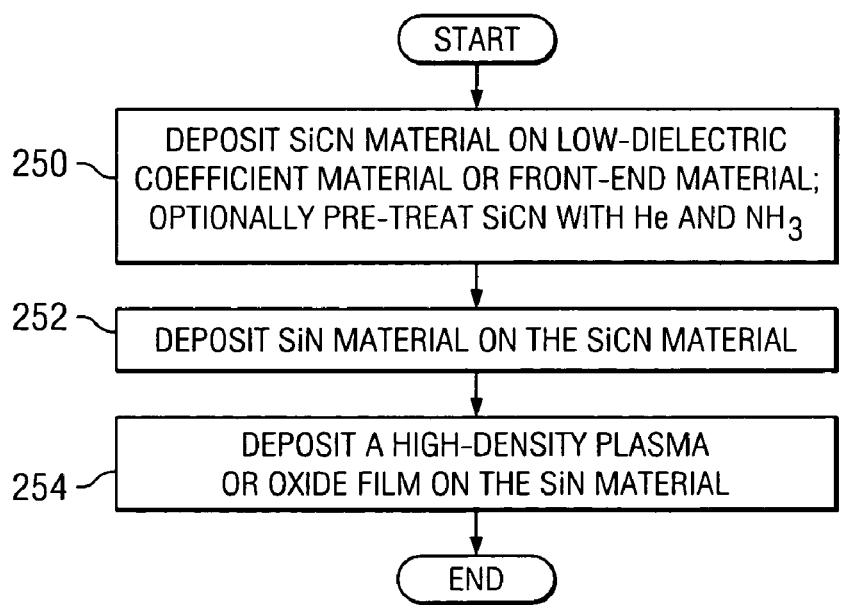
FIG. 1*b* shows a process that implements the embodiment of FIG. 1*a*.

An exemplary process of forming the film stack 102 of FIG. 1a is shown in FIG. 1b. The process may be implemented by first depositing a silicon carbide material adjacent (e.g., abutting) a relatively low-dielectric constant ("low-k") dielectric material, such as the OSG described above, or adjacent any suitable front-end material (block 250). The low-k material and/or the front-end material may be less than approximately 15 kilo-angstroms and preferably range between approximately 1 kilo-angstrom and approximately 15 kilo-angstroms in thickness. If OSG is used, the OSG may be deposited adjacent the dielectric stack using a Novellus® Sequel Chamber, although OSG or other low-k dielectric material may be deposited using any suitable chamber. The silicon carbide material may be deposited using a suitable Applied Materials® chamber or any appropriate chamber.

A silicon nitride material then may be deposited adjacent (e.g., abutting) the silicon carbide material (block 252), so that a silicon carbide and silicon nitride bi-layer etch stop stack is formed. The silicon nitride layer may be deposited using a Novellus® Sequel Chamber or any other suitable chamber. Finally, at block 254, a high-density plasma fluoro-silicate glass, phospho-silicate glass or any other suitable type of oxide film (e.g., plasma-enhanced FSG or tetraethylorthosilicate) is deposited adjacent (e.g., abutting) the silicon carbide and silicon nitride bi-layer etch stop stack. In at least some embodiments, this oxide film may have a thickness less than approximately 20 kilo-angstroms and further, preferably between approximately 1 kilo-angstrom and approximately 20 kilo-angstroms. If FSG is used, the FSG may be deposited using a Novellus® Speed Chamber, although FSG or any other type of oxide film may be deposited using any suitable chamber and/or any suitable technique.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of forming a film stack in an integrated circuit, comprising:
    depositing a layer of silicon carbide adjacent a first layer of dielectric material;
    depositing a layer of silicon nitride adjacent the layer of silicon carbide; and
    depositing a layer of high density oxide film having a thickness of at least one kilo-angstrom adjacent the layer of silicon nitride,
    wherein depositing the layer of silicon carbide adjacent the first layer of dielectric material comprises depositing the layer of silicon carbide in contact with a layer of organo-silicate glass, wherein an adhesive strength between the organo-silicate glass and the silicon carbide reduces delamination defects in the integrated circuit and depositing the layer of silicon nitride adjacent the layer of silicon carbide reduces via-stress migration in the integrated circuit.

2. The method of claim 1, further comprising pre-treating the layer of silicon carbide with a substance selected from the group consisting of helium and ammonia.

3. The method of claim 1, wherein depositing the layer of silicon carbide in contact with the first layer of dielectric material comprises depositing the layer of silicon carbide adjacent a first layer of dielectric material that has a thickness between approximately 1 kilo-angstrom and approximately 15 kilo-angstroms.

4. The method of claim 1, wherein depositing the layer of silicon carbide comprises depositing a layer of silicon carbide that has a thickness of less than approximately 300 angstroms.

5. The method of claim 1, wherein depositing the layer of silicon nitride comprises depositing a layer of silicon nitride that has a thickness between approximately 300 angstroms and approximately 900 angstroms.

6. The method of claim 1, wherein depositing the layer of high density oxide film comprises depositing a layer of high density oxide film that has a thickness between approximately 1 kilo-angstrom and approximately 20 kilo-angstroms.

7. The method of claim 1, wherein depositing the layer of high density oxide film comprises depositing a film selected from the group consisting of fluoro-silicate glass, phospho-silicate glass and tetraethylorthosilicate.

8. A method, comprising:
    depositing a first layer of organo-silicate glass adjacent a dielectric stack;
    depositing a layer of silicon carbide in contact with the first layer of organo-silicate glass, wherein an adhesive strength between the organo-silicate glass and the silicon carbide reduces delamination defects in an integrated circuit;
    a pre-treating step for removing at least some passivation chemicals from the silicon carbide layer;
    depositing a layer of silicon nitride adjacent the layer of silicon carbide, wherein depositing the layer of silicon nitride adjacent the layer of silicon carbide reduces via-stress migration in the integrated circuit; and
    depositing a second layer of dielectric material adjacent the layer of silicon nitride.

9. The method of claim 8, wherein depositing a second layer of dielectric material comprises depositing plasma-enhanced fluoro-silicate glass.

* * * * *